United States Patent [19]

Harr

[11] Patent Number: 5,736,866

[45] Date of Patent: Apr. 7, 1998

[54] ACTIVE PULL-DOWN CIRCUIT FOR ECL USING A CAPACITIVE COUPLED CIRCUIT

[75] Inventor: Jerome D. Harr, San Jose, Calif.

[73] Assignee: Kabushiki Kaisha Toshiba, Kawasaki, Japan

[21] Appl. No.: 555,969

[22] Filed: Nov. 13, 1995

[51] Int. Cl.[6] ............................................. H03K 19/013
[52] U.S. Cl. ............................................. 326/18; 326/126
[58] Field of Search ............................ 326/18, 126, 89

[56] References Cited

U.S. PATENT DOCUMENTS

| 3,978,347 | 8/1976 | Hollstein et al. | 326/126 |
|---|---|---|---|
| 4,347,446 | 8/1982 | Price | 326/90 |
| 4,577,125 | 3/1986 | Allen | 326/91 |
| 4,680,480 | 7/1987 | Hopta | 326/75 |
| 4,926,065 | 5/1990 | Coy et al. | 326/77 |
| 5,059,827 | 10/1991 | Phan | 326/126 |
| 5,073,728 | 12/1991 | Ovens | 326/126 |
| 5,111,074 | 5/1992 | Gravrok et al. | 326/18 |
| 5,118,973 | 6/1992 | Sakai et al. | 326/126 |
| 5,122,683 | 6/1992 | Sugoh | 326/126 |
| 5,177,379 | 1/1993 | Matsumoto | 326/126 |
| 5,210,446 | 5/1993 | Niuya et al. | 327/536 |
| 5,216,296 | 6/1993 | Tsunoi et al. | 326/126 |
| 5,237,216 | 8/1993 | Hayano et al. | 326/126 |
| 5,381,057 | 1/1995 | Kuroda et al. | 326/126 |
| 5,384,498 | 1/1995 | Wong | 326/31 |

FOREIGN PATENT DOCUMENTS 3-224315  10/1991  Japan ............................ 326/126

OTHER PUBLICATIONS

Kuroda, et al., "Capacitor-free level-sensitive active pull-down ECL circuit with self-adjusting drive capacity", Symp. VLSI Circuits Dig. Tech. Papers, May 1993, pp. 29–30.

C.T. Chuang et al. "High-Speed low power ECL Circuit with ac-coupled self-biased dynamic current source and active-pull-down emitter-follower stage", IEEE J. Solid-State Circuits, vol. 27, No. 8, pp. 1207–1210, Aug. 1992.

D'Agostino, Michael; "Reactive Emitter-Follower Logic Gate"; RCA Technical Notes No. 791; Sep., 1968.

*Primary Examiner*—Edward P. Westin
*Assistant Examiner*—Benjamin D. Driscoll
*Attorney, Agent, or Firm*—Limbach & Limbach LLP; Ronald L. Yin

[57] ABSTRACT

Fast fall time for ECL logic waveforms are produced by use of a circuit, which very quickly transfers charge from the ECL output load capacitance into a temporary holding capacitor. The charge transferred onto the temporary holding capacitor may then be removed at a leisurely pace. The circuit includes a pulldown transistor, and a control circuit that selectively turns the pulldown transistor on, if the ECL output will be low, or off, if the ECL output will be high. The control circuit includes an emitter-follower transistor which follows the differential ECL collector node that changes voltage inversely to the desired final ECL output. A diode is connected to the emitter-follower transistor's emitter so that the diode output is two diode drops below the ECL collector node inverse in polarity to the output. The diode drives the base of the pulldown transistor, so that the base of the pulldown transistor remains static until the inputs to the circuit change.

26 Claims, 5 Drawing Sheets

ACTIVE PULL-DOWN CIRCUIT FOR ECL USING A CAPACITIVE COUPLED CIRCUIT

BACKGROUND OF THE INVENTION

1. Field of the Invention

The present invention relates to the field of Emitter Coupled Logic (ECL) pulldown output circuits. Specifically, the present invention relates to decreasing the power-delay product in ECL circuits by using and controlling an active pulldown circuit and a temporary holding capacitor in order to reduce output fall times and power consumption.

2. Discussion of the Related Art

Active pull-down circuits for Emitter Coupled Logic (ECL) are not new. A paper by Kuroda, et al., "Capacitor-free level-sensitive active pull-down ECL circuit with self-adjusting drive capability", in Symp. VLSI Circuits Dig. Tech. Papers, May 1993, pp. 29–30, describes a pull-down circuit using transistors whose emitters are connected to a regulated voltage which is distributed across the chip.

The circuitry described by Kuroda, et al., has the limitation of having to route an additional voltage bus around the chip and requiring very small voltage drops along this bus. In addition, only inverting operation of the logic circuit is allowed.

Other pulldown circuits use a capacitively coupled cicuit transistor to discharge the load capacitance into a temporary holding capacitor. One example is given in:

C. T. Chuang et al., "High-Speed low-power ECL Circuit with ac-coupled self-biased dynamic current source and active-pull-down emitter-follower stage", IEEE J. Solid-State Circuits, vol. 27, no. 8, pp. 1207–1210, August 1992.

The circuitry described by Chuang et al. requires a rather large coupling capacitor in addition to the regulating capacitor, requiring large cell area. Another limitation is that the internal circuit node that drives the coupling capacitor can have slow fall times, prohibiting its use in complementary outputs.

Other pulldown circuits that use capacitively-coupled circuit transistors are disclosed by Tsunoi et al., U.S. Pat. No. 5,216,296, (Logic Circuit Having Sharper Falling Edge Transition), hereinafter Tsunoi '296. Particularly, the circuit shown in FIG. 12 of Tsunoi '296 relies on pulldown transistors Q22 and Q32 to discharge the complementary ECL output nodes Dout. Tsunoi '296 appears to be concerned primarily with reducing an output load capacitance discharge time while minimizing power consumption using capacitively-coupled active pulldown transistors Q22 and Q32. Tsunoi '296 FIG. 12 also discloses "speed up" capacitors C and C22 to which charge from the loads (presumably connected to Dout) can be temporarily transferred during high to low output transitions.

SUMMARY OF THE INVENTION

One object of the invention is to provide a means of achieving a fast fall time for an ECL circuit's output without requiring an internal coupling capacitor. Another object of the present invention is to provide a means of achieving substantially equal rise and fall times from the circuit output. Yet another object of the present invention is to provide fast fall times without requiring that the circuit be limited to inverting logic configurations only. A further object of the present invention is to produce a circuit that can provide fast fall times on both inverting and non-inverting outputs of the circuit. In other words, to produce a circuit with the capability of having complementary outputs. A still further important object of the present invention to provide a circuit with a lower "power-delay product" than standard ECL.

The circuitry according to the embodiments of the present invention achieves a fast fall time for ECL logic waveforms by use of a circuit, which very quickly transfers charge from the ECL output load capacitance into a temporary holding capacitor. Because charge has been quickly removed from the output, its voltage falls very rapidly. The charge that was stored on the temporary holding capacitor may then be removed at a leisurely pace. The circuit includes a pulldown transistor, and a control circuit that selectively turns the pulldown transistor on, if the ECL output will be low, or off, if the ECL output will be high. The control circuit includes an emitter-follower transistor which follows the differential ECL collector node that changes voltage inversely to the desired final ECL output. A diode is connected to the emitter-follower transistor's emitter so that the diode output is two diode drops below the ECL collector node that is inverse in polarity to the output. The diode drives the base of the pulldown transistor, so that the base of the pulldown transistor remains at a static voltage until the inputs to the circuit change.

According to another embodiment of the present invention, complementary outputs are produced. The pullup transistor of the inverted output is used as the emitter-follower in the control circuit for the pulldown of the non-inverted output, and the pullup transistor of the non-inverted output is used as the emitter-follower in the control circuit for the pulldown of the inverted output. Thus, only one emitter follower is connected to each differential collector node even though complementary outputs are achieved. This reduces the load on the differential nodes of the basic ECL differential amplifier, and thereby allows switching with less delay.

According to another aspect of the present invention, a discharge transistor which is capacitively coupled to the circuit output provides a way of quickly discharging the temporary holding capacitor during charging of the output node. This prepares the temporary holding capacitor to discharge the output node again if the inputs change so as to cause the output to fall within a very short time of rising. Since the discharge transistor only remains on during a time in which the temporary holding capacitor is being charged, substantially equal rise and fall times are achieved without excessive power consumption.

These and other aspects of the present invention will be apparent from the drawings as fully explained in the detailed description of the invention.

BRIEF DESCRIPTION OF THE DRAWINGS

The following Figures, in which corresponding elements in different Figures are labelled with the same numerals, illustrate the various aspects and features of the present invention and its preferred embodiments.

The Figures are more fully explained in the Detailed Description of the Invention.

DETAILED DESCRIPTION OF THE INVENTION

The circuit described by Tsunoi '296 FIG. 12 has the disadvantage that it requires internal coupling capacitors C21 and C31 to couple the bases of the active pulldown transistors Q22 and Q32, respectively. Resistor R24 and capacitor C21 form a resistor-capacitor (RC) pulldown base control circuit for pulldown transistor Q22. Similarly resistors R34 and capacitor C31 form a resistor-capacitor (RC) pulldown base control circuit for pulldown transistor Q32. As a result, the pulldown strengths of Q22 and Q32 in Tsunoi '296 FIG. 12 vary transiently as governed by the time constants of the RC pulldown base control circuits. Thus, the controls to the active pulldown transistors Q22 and Q32 are essentially time derivative functions of the differential outputs (collectors of transistors Q11 and Q12) the basic ECL differential amplifier stage.

In order to minimize the power-delay product of the circuit, the time constant of the pulldown control circuits for each logic gate should be adjusted in correspondence with the intended output load capacitance that the gate is intended to drive. The internal time constant should be longer for larger output load capacitances so as to provide greater pulldown strength for a longer transient duration and thereby fully discharge the load in minimum time. Conversely, the internal time constant should be shorter for smaller output load capacitances in order to minimize power consumed by the control circuit.

A similar time constant adjustment should be made in accordance to the intended operating frequency of the gate. A gate operating at a relatively high frequency should have a time constant within the control circuit which allows any transient to fully die away by the time that the inputs change to compute the next logical output. Thus, a gate operating at a higher frequency requires a smaller time constant in order to perform correctly. Similarly, gates operating at lower frequencies should have larger time constants in order to maximize the effect of the transient increased pulldown strength.

Even if the pulldown control circuits disclosed in Tsunoi '296 are optimized for the intended frequency and output load capacitance, they are still less than optimal because the increase or decrease in the pulldown strength is necessarily a transient. In other words, the increase or decrease in pulldown strength is not at a maximum for the entire duration of the circuit's output period. Instead, the increase or decrease in drive strength is only a maximum at the beginning of the output drive period, and dies away exponentially (with some selected time constant), as the output drive period elapses. It would be desirable to maintain the increase or decrease in pulldown strength for the entire duration of the output drive period.

Figure 1:
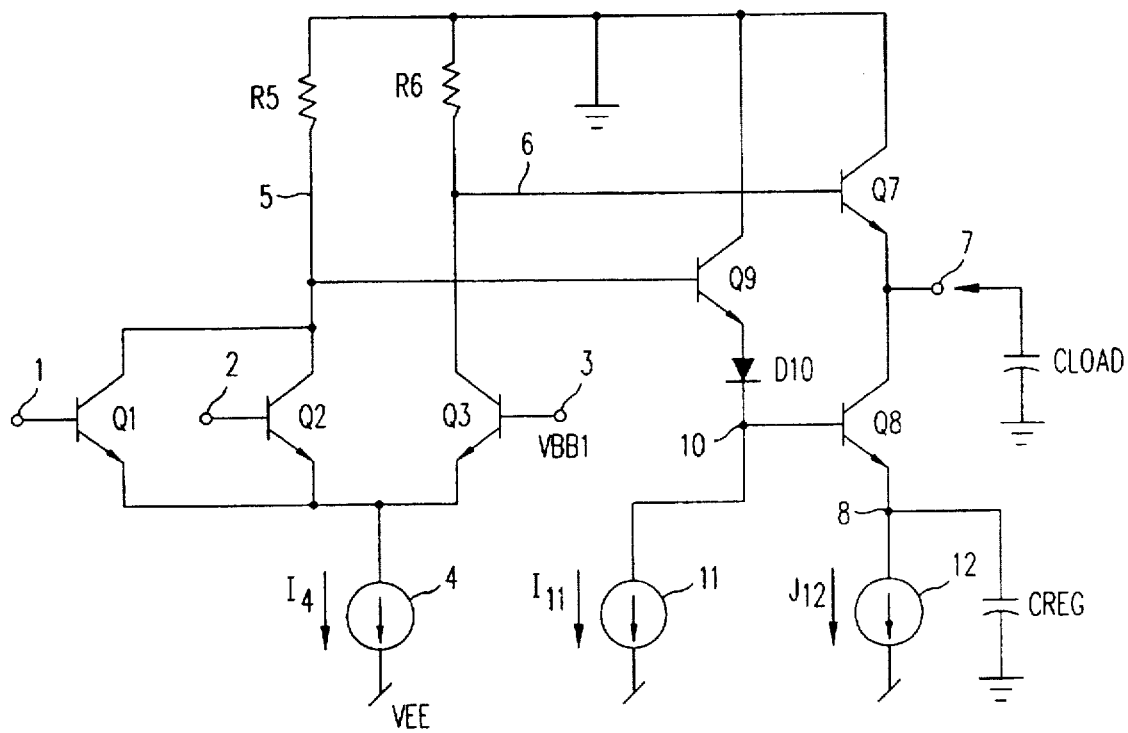
FIG. 1 illustrates an OR circuit according to one embodiment of the present invention.

FIG. 1 shows a circuit schematic of a two input OR circuit according to one embodiment of the present invention. The circuit consists of transistors Q1, Q2, Q3, current source 4, and resistors R5 and R6 connected as a conventional ECL OR circuit. Transistor Q7 is connected as a conventional emitter follower to provide a logic level signal at output terminal 7. Load capacitor CLOAD, which is connected to output 7 represents the capacitance from wiring, stray capacitance and other circuitry that may be connected to the OR circuit's output.

In conventional ECL circuitry, a current source would be connected to the emitter of transistor Q7 to provide a means to discharge CLOAD and allow the voltage at output 7 to fall. However, according to the present invention, a transistor Q8 is arranged so as to provide the current to discharge CLOAD while the base of Q8 is driven directly by a second emitter follower Q9 and dropping diode D10. The base of emitter follower Q9 is connected to the differential collector output node 5. A bias current source 11 is connected to diode 10 to discharge the small parasitic capacitance when node 10 falls. Additionally, a current source 12 and capacitor CREG are connected to the emitter of Q8. CREG acts as a temporary holding capacitor for charge transferred from CLOAD, and current I12 in current source 12 acts to discharge CREG, and to provide bias current to Q8.

Figure 2:
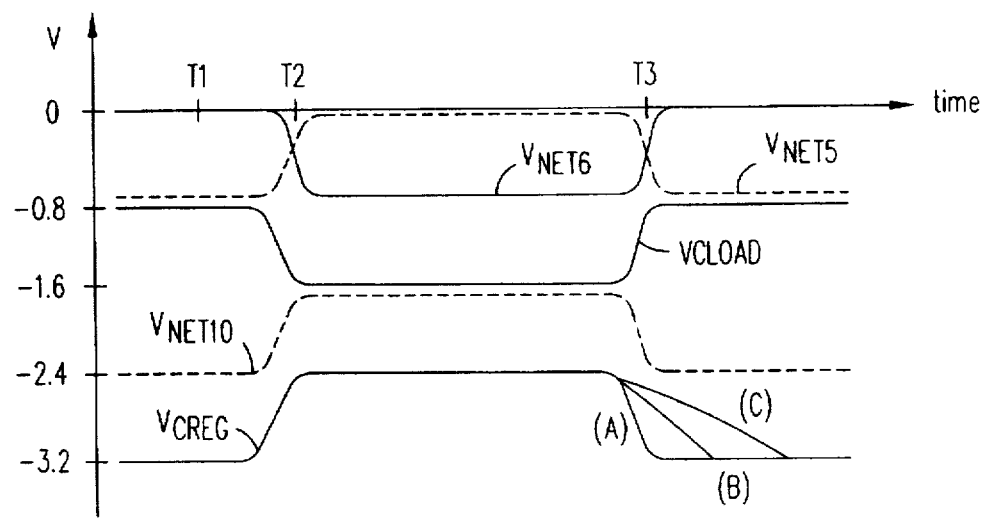
FIG. 2 is a voltage-time plot showing some selected node voltages of the circuit of FIG. 2 during typical operation of the circuit.

Operation of the circuit can better be understood with the help of the waveforms shown in FIG. 2. Assume that by time T1, the voltage VNET5 at node 5 has been down for a long time, so that the voltage VCREG at node 8 is at its lowest voltage, because CREG has been fully discharged by current I12. If the voltage swings at nodes 5 and 6 are approximately equal to a diode drop of 0.8 V as they usually are, then VCREG will be 4 diode drops below ground, or –3.2V.

At time T2 assume VNET6 drops by 0.8V and VNET5 rises 0.8V due to a change in circuit input voltages. Then the voltage at node 10, VNET10, rises by 0.8V, causing the voltage at the emitter of circuit transistor Q8 to rise by the same amount. If the voltage at node 8 rises by 0.8V, then a known amount of charge Q=0.8V×CREG has been transferred into CREG. Substantially all this charge must flow into the collector of Q8, and must be supplied by CLOAD rather than transistor Q7. Transistor Q7 does not conduct because the voltage at the base of Q7 has fallen by 0.8V, so that base-emitter voltage of transistor Q7 is greater than zero, but less than the 0.8 volts necessary to forward bias transistor Q7, thereby preventing it from sourcing current until the voltage at output 7 has fallen to substantially the low logic output voltage level.

Since the voltage at the base of Q8 has risen quickly, charge is pulled from CLOAD very quickly, causing a rapid decrease in voltage at output node 7. If CLOAD is equal to CREG, then a rapid drop of 0.8V will occur at output 7, since essentially all the charge of Q=0.8V×CREG comes from CLOAD, because the base current in Q8 is small in relation to its collector current. The voltage change on CLOAD will be Q divided by CLOAD, which is 0.8V.

The rise time of the voltage waveform at node 5 is approximately the same as the fall time at node 6, and the fall time of the voltage waveform at node 5 is approximately the same as the rise time at node 6. Transistor Q7 insures that, if node 7 is two diode below ground while node 1 is one diode drop below ground, a rapid rise at node 6 will cause the same rapid rise at output node 7. Since node 8 follows node 5 by three diode drops, then the voltage VCREG will have the same rapid rise time as node 5. Because the current coming into CREG comes almost entirely from CLOAD and is caused by the rapid rise of node 8, it will cause a falling transition at node 7, the output, taking the same amount of time as the rise of node 5. This demonstrates that the rise and fall times of the output node 7 are substantially equal and controlled.

At time T3 in FIG. 2, VNET6 rises, pulling up the output through transistor Q7. At the same time VNET5 falls, lowering the voltage at node 10. Current in transistor Q8 now goes to zero, since the voltage at the emitter of Q8 cannot drop quickly enough to keep transistor Q8 forward biased because current I12 discharges CREG at a predetermined rate not related to the fall time of node 10. Since the current in Q8 is zero, output emitter follower Q7 can pull up CLOAD faster than standard ECL can, because Q7 can provide all its output current to CLOAD, and does not have to share it with Q8.

The voltage of capacitor CREG now falls at a rate determined by the choice of current I12 in source 12. A high current I12 will make the voltage fall quickly, as shown by curve (A) in FIG. 2, whereas an intermediate level current will make it fall at an average quickness as shown by curve (B), and a lesser current will make it fall less quickly as shown by curve (C). Current I12 must be chosen to provide a fast enough discharge time for CREG. Increasing the size of I12 increases the frequency of operation of the circuit at the expense of higher power consumption, and conversely, decreasing the size of I12 decreases the frequency of operation, but also decreases power consumption.

The current sources shown as 4, 11, 12 were shown as ideal sources, but in fact can be made from various transistor circuits that are commonly used in the art. Typically, each would consist of a transistors forward biased by a reference voltage in series with a resistor connected to the negative supply voltage.

Figure 3:
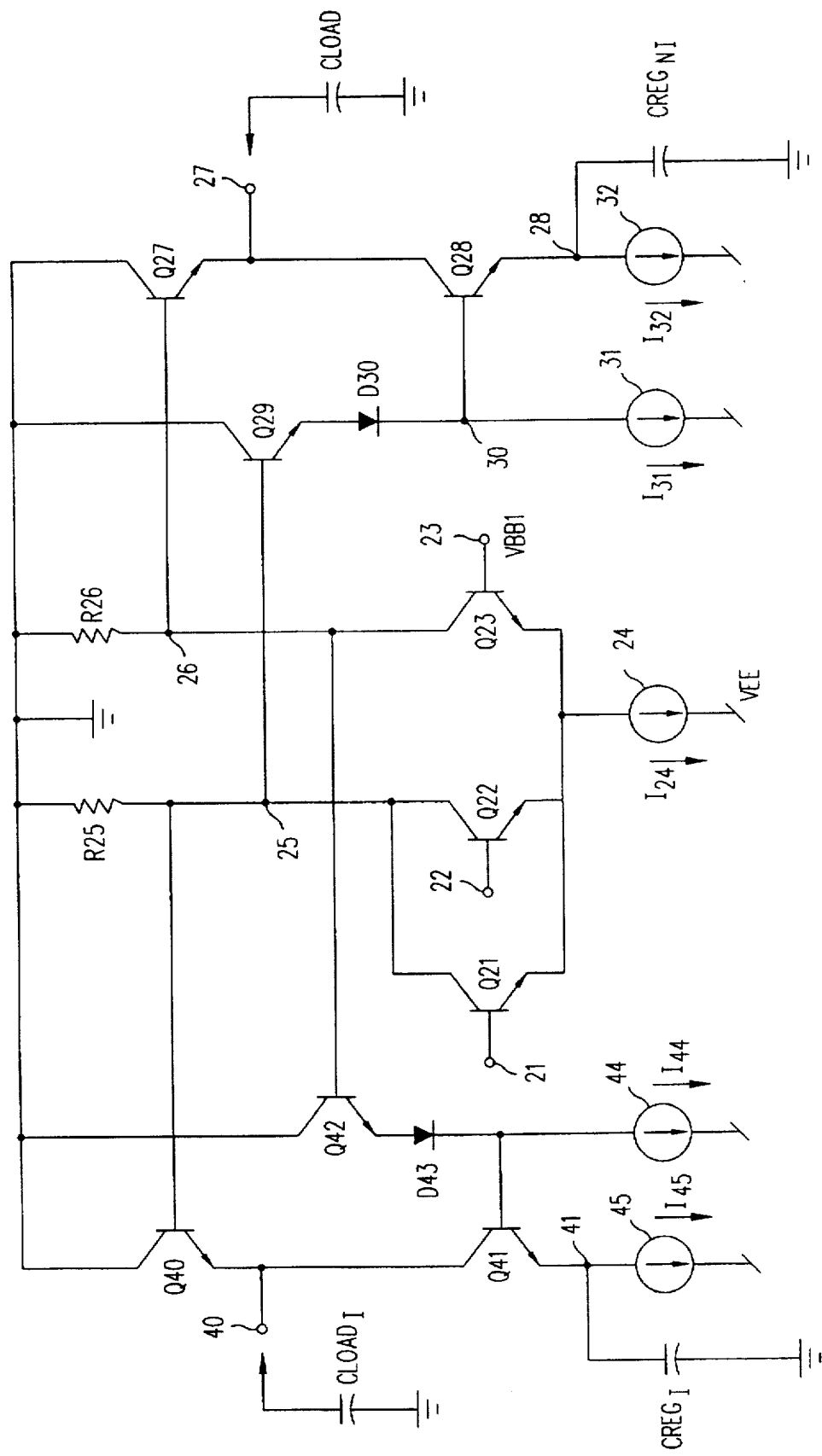
FIG. 3 illustrates one embodiment of an OR circuit having complementary outputs according to the present invention.

FIG. 3 shows one embodiment of a complementary output OR circuit according to the present invention. This circuit is basically the same circuit as shown in FIG. 1, with the addition of devices Q40, Q41, Q42, D43, CREGi, and current sources 44 and 45 which duplicate the output emitter follower and circuit circuitry for the opposite polarity output. The resulting circuit has a non-inverting output 27, and an inverting output 40, to which equivalent capacitors CLOADni and CLOADi are attached, which model the wiring and parasitic loads.

Figure 4:
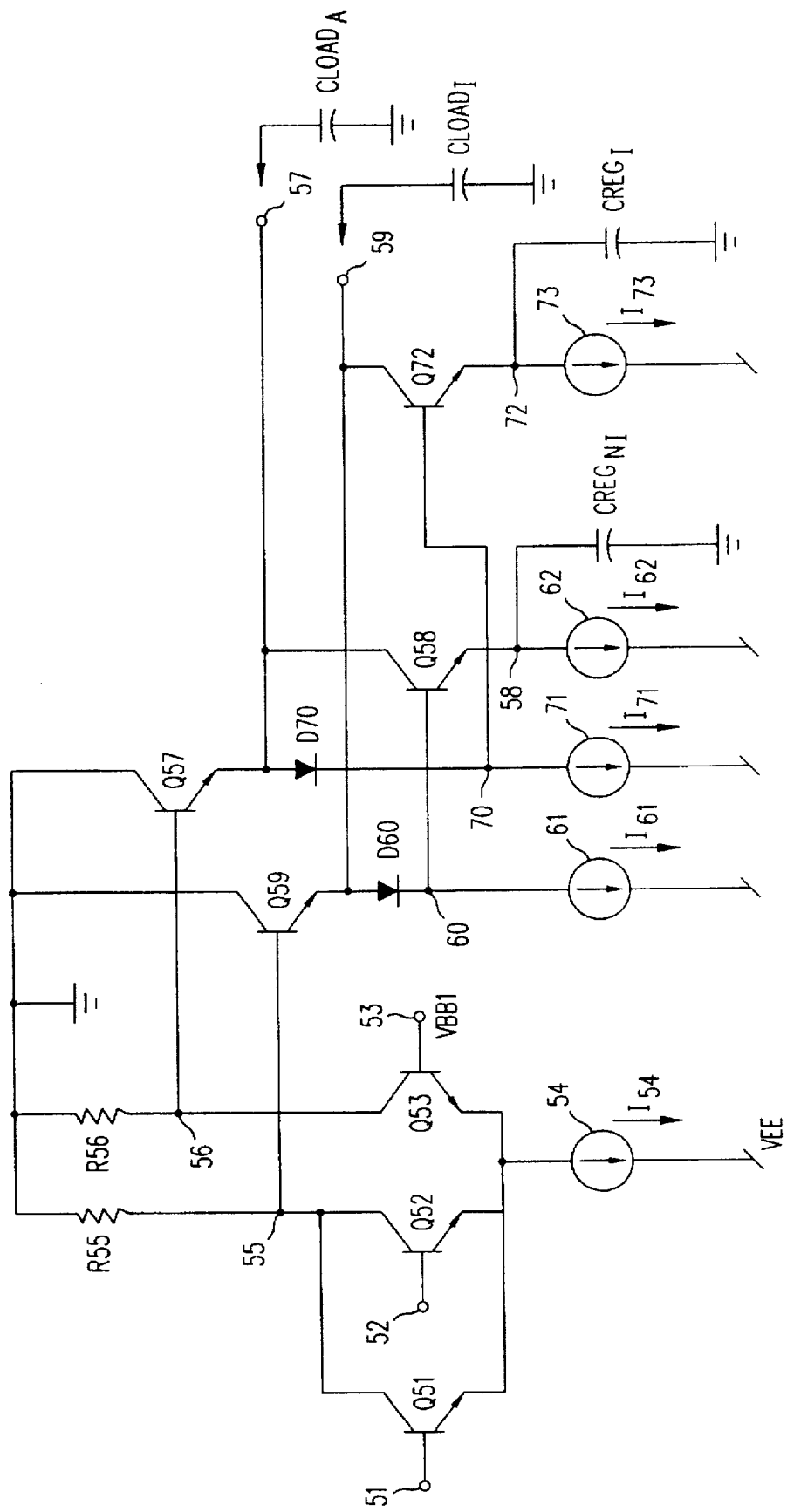
FIG. 4 illustrates another embodiment of an OR circuit having complementary outputs according to the present invention.

FIG. 4 shows a second embodiment of a complementary output OR circuit. Instead of having two emitter followers connected to each of the two collector nodes 55 and 56 as in the first embodiment shown in FIG. 3, each collector node 55 and 56 has a single emitter follower, transistor Q59 and Q57, respectively attached. These transistors function to provide complementary outputs 59 and 57 and also serve to operate the transistors Q58 and Q72 charge pumps.

Referring to FIG. 4, operation of the circuit may be understood by considering the case of collector node 56 rising from its low level to its high level, and simultaneously node 55 falling from high to low. Emitter follower Q57 will follow the rising base voltage and produce a rising output at the non-inverting output 57, in addition to charging up CLOADni. Q57 pulls up node 70 through diode D70, thereby turning on charge pump transistor Q72 in order to discharge the inverting output 59. Charge pump Q72 now pulls charge from inverting output node load capacitor CLOADi, and moves this charge into capacitor CREGi. This movement of charge facilitates the rapid fall of inverting output node 59.

From circuit symmetry, it can be seen that each of the output emitter followers Q57 and Q59 serves to provide a means of rapidly pulling up the output capacitors, as well as operating the transistors Q58 and Q72 to provide fast falling voltages at the opposite outputs.

Figure 5:
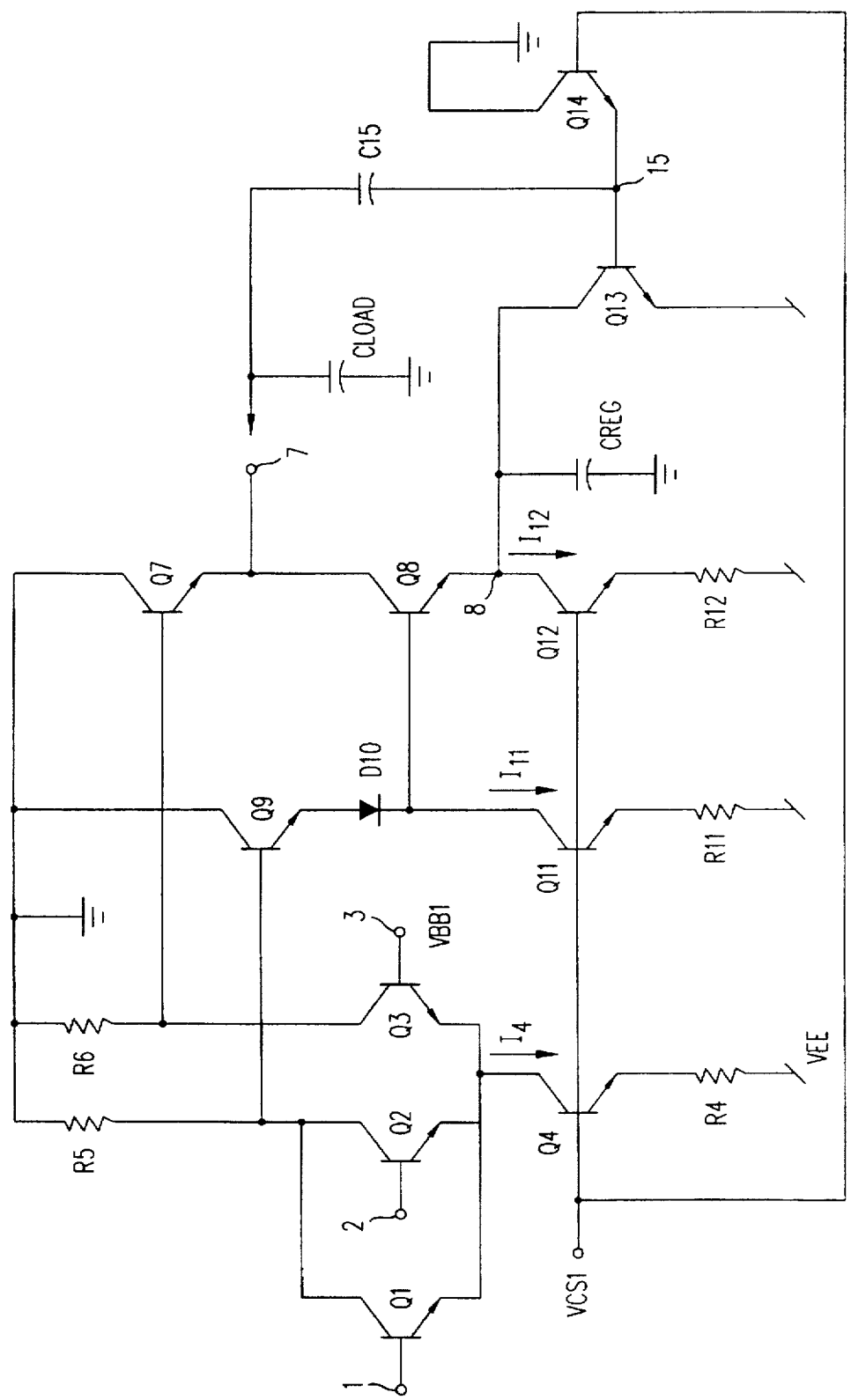
FIG. 5 illustrates an embodiment of an OR circuit according to another aspect of the invention having a low-power temporary storage capacitor discharge circuit according to another aspect of the present invention.

FIGS. 2, 4, and 5 show OR circuits, to which are attached the output circuits described above. These OR circuits are shown by way of example only. Any other logic circuit that produces complementary internal signals that could be used as inputs to output emitter followers may be substituted. The output circuits described can also be used in latches and flip-flops to improve output waveform fall times.

In the embodiments discussed above, a capacitor CREG is used as a temporary holding capacitor. This capacitor becomes charged from charge that is pulled out of the circuit's load capacitance, CLOAD. CLOAD is quickly discharged by this charge transfer, providing excellent rise and fall times for the circuit.

However, before CREG can be used again for enhancing the circuit's fall time, CREG itself must be discharged to make room for new charge. As discussed above, CREG is discharged by current I12 in source 12. The dilemma is that if I12 is small, then CREG will take a long time to discharge, limiting the maximum frequency of operation; if I12 is large, the frequency limitation is removed, but power is now large. Reducing power and improving the output fall delay at the same time is one of the objects of this invention.

The circuitry according to the present invention, then, has a lower power-delay product than standard ECL because a small I12 can be used while still getting short fall delays. Standard ECL must use a large I12 to obtain a shorter fall-time delay. The circuits according to the present invention obtain fast fall delays and reduced power by reducing I12. If current I12 is increased to discharge CREG more quickly, then one of the major objects of the invention will be compromised.

Thus, it is desirable to be able to discharge CREG quickly, so the maximum frequency of operation is not limited, and simultaneously use a small current I12 so as to reduce power consumption. According to another aspect of the present invention, another embodiment of the present invention, shown in FIG. 5, meets the above objectives of high frequency, low power operation.

The circuit shown in FIG. 5 is similar to the circuit shown in FIG. 1; however, the circuit shown in FIG. 5 includes additional transistors Q13 and Q14, and an additional capacitor C15. These additional components are arranged to rapidly discharge CREG, as will now be described.

Figure 6:
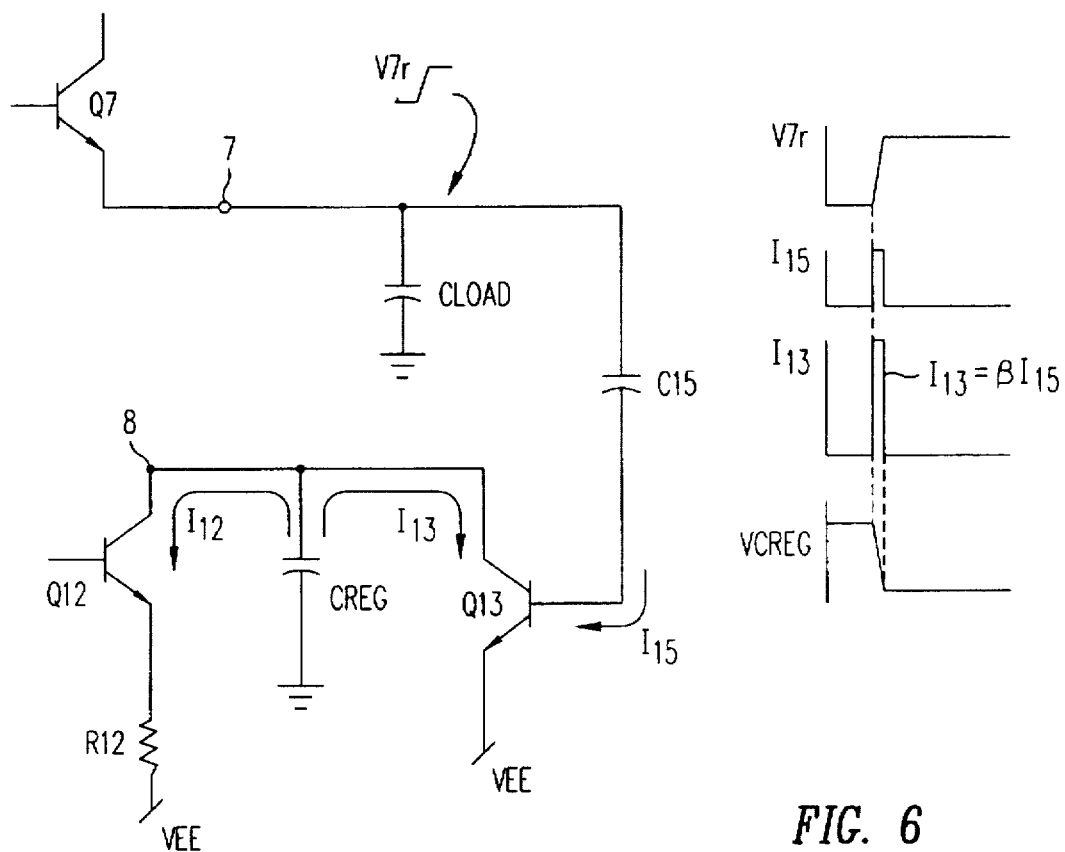
FIG. 6 depicts a subcircuit of the circuit shown in FIG. 6 during charging of the output load and discharging of the temporary storage capacitor.
Figure 7:
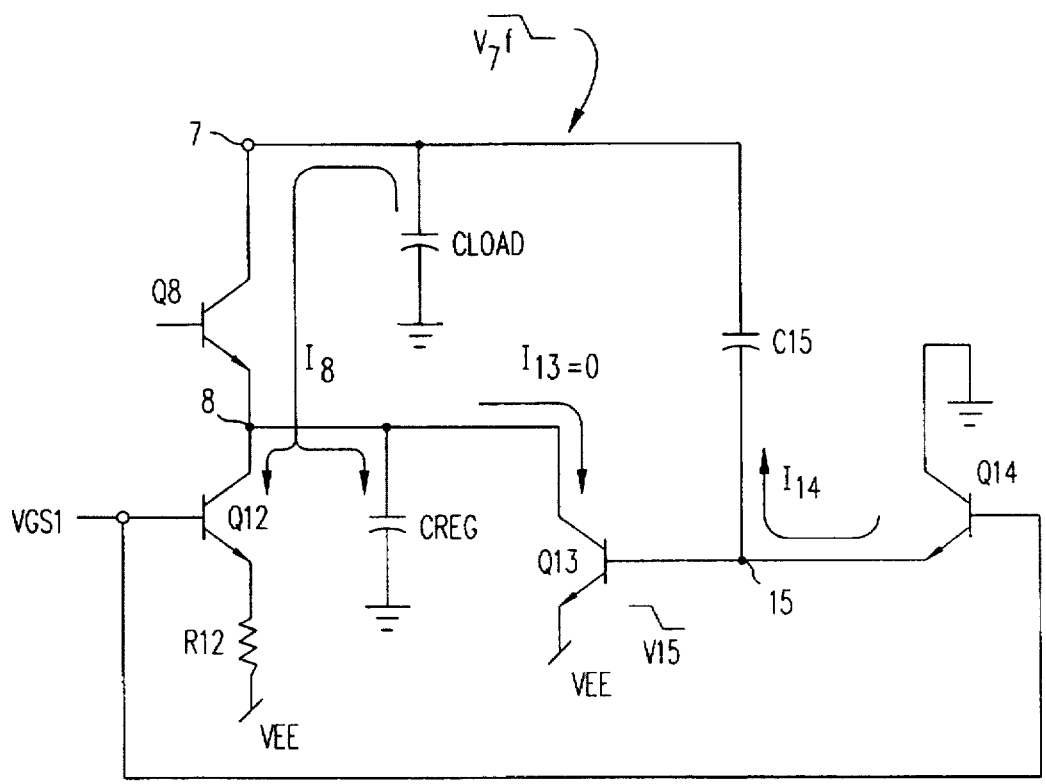
FIG. 7 depicts another subcircuit of the circuit shown in FIG. 6 during discharging of the output load and charging of the temporary storage capacitor.

Operation of the additional devices can better be understood by partitioning the circuit of FIG. 5 into two figures, which show only those components which are involved with CREG discharge (FIG. 6) and only those components involved in CREG charge (FIG. 7).

Referring to FIG. 6, the rapid discharge of CREG is accomplished during the time of rapid rise of node 7 (the output node) caused by transistor Q7. As node 7 rises, a rising voltage transition (designated by V7r in FIG. 6) is coupled through capacitor C15 into the base of transistor Q13. This rising transition causes current I15 to flow into Q13's base, which in turn causes a current I13 to flow in Q13's collector. This current is equal to I15 multiplied by the beta of transistor Q13. In modern integrated circuit technology, beta is typically 100. So, current I13 is typically 100 times I15. Current I13 draws charge from CREG. Because voltage V7r is a rapidly rising edge, current I13 is large, discharging CREG quickly. The much smaller current I12 through Q12 also helps to discharge CREG.

FIG. 7 describes the operation during CREG charge. During this time, the circuit transistor Q8 is being operated in a manner to rapidly discharge CLOAD into CREG as discussed above. So output node 7 is falling rapidly. This rapid fall of node 7, (designated as V7f in FIG. 7) is coupled through capacitor C15 into junction 15, which is the junction of the base of Q13 and the emitter of Q14. The resulting voltage at node 15 is designated as V15 in FIG. 7. The negative swing of V15 by more than 100 mV will insure that Q13 will be off because its base-emitter diode bias will now be at least 100 mV lower than the 0.8V forward bias voltage required for substantial current conduction. Q14 will turn on when its base-emitter diode is forward biased. Since VCS1 is approximately 1.2V above VEE and base-emitter forward voltage drops are approximately 0.8V, Q14 will conduct when its emitter has fallen to about 0.4 Volts above VEE, clamping node 15 at that voltage. Thus, C15 discharges through Q14's emitter. This prepares C15 to be used for the next CREG discharge. Transistor Q13 remains off as its base-emitter voltage has now fallen to and remains at about 0.4 Volts.

Capacitor C15 is charged up through the base of Q13 and discharged through the emitter of Q14. The positive transition V7r at node 7 charges C15 through Q13 (accomplishing the discharge of CREG at the same time), and the negative transition V7f discharges C15 through Q14. If VEE is –5.2V, for example, then capacitor C15 is charged to about 3.6 Volts, since node 7 (C15's positive terminal) rises to about –0.8V while node 15 (C15's negative terminal) can only rise to about –4.4V, being clamped to one diode drop above VEE by Q13's base-emitter diode. Capacitor C15 discharges to about 3.2V, since node 7 falls to about –1.6V while node 15 falls to about –4.8V. In order to optimally choose the size of C15, the charge transferred from C15 times beta should equal the charge transferred to CREG. Therefore, by applying the appropriate numbers assuming VCS1 is –4.0V and VEE is –5.2V, C15 should be at least 2×CREG/beta.

In the Figures, C15 is shown as a single capacitor element. In fact C15 is made up of multiple transistors with their collectors and emitters connected to node 7 and their bases connected to node 15. Such an arrangement is common in the art.

In the Figures, the collector of Q14 is shown as connected to ground. This collector can be connected to any convenient source of potential that will allow normal forward operation of the transistor. In the preferred embodiment shown in FIG. 5, Q14's collector will be connected to CREG for reasons of convenience in the physical design of the circuit. Circuit operation is substantially the same with either connection of Q14's collector. It was shown connected to ground for clarity of explanation of operation.

While the present invention has been disclosed with particular reference to its preferred embodiments, those embodiments are presented by way of example, not by way of limitation. Those of ordinary skill in the art would be enabled by this disclosure to add to or modify the embodiment of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

In the preceding description of the invention, capacitor CREG was described as being equal to CLOAD to easily illustrate the principles of operation of the invention. However, CREG can be reduced to almost the value CLOAD/2 and still have a significant advantage over the ECL circuit of the prior art.

Referring again to FIG. 1, let the rise time of the voltage at node 5 be designated as TR5. From the previous discussion it was shown that if CREG=CLOAD, the fall time of the output voltage at node 7 is approximately equal to TR5. Node 8 is caused to rise 0.8V in a time interval TR5 and a charge:

$$Q=CREG \times 0.8V=CLOAD \times 0.8V/2$$

will be removed from CLOAD. This causes the voltage at node 7 to fall 0.4V in a time interval TR5. This is the switching point of the logic circuits that are connected to the output node 7. Therefore, if CREG is slightly larger than CLOAD/2, the following logic circuits will be caused to switch after only a time TR5. Even though this time is slightly longer than if CREG=CLOAD, nevertheless it is still substantially faster than conventional ECL. Therefore, making CREG approximately equal to CLOAD/2 will still result in a substantially improved power delay circuit, even though the symmetrical rise and fall times benefit will be slightly compromised because output node 7 will reach the logic switching point in time TR5 instead of TR5/2 that was obtained when CREG=CLOAD.

What is claimed is:

1. An emitter-coupled logic (ECL) output pulldown circuit that discharges an output node based upon a reduction in voltage at a collector node, comprising:

a pulldown transistor having a pulldown collector, a pulldown emitter, and a pulldown base;

a temporary storage capacitor having a positive capacitor terminal and a negative capacitor terminal;

a diode having a diode input and a diode output; and a control transistor having a control collector, a control emitter, and a control base;

wherein the control collector is connected to a positive supply voltage, the control base is connected to the collector node, and the control emitter is connected to the diode input, and wherein the pulldown collector is connected to the output node, the pulldown base is connected directly to the diode output, and the pulldown emitter is connected to the positive capacitor terminal.

2. An emitter-coupled logic (ECL) output pulldown circuit as in claim 1, wherein the negative capacitor terminal is connected to the positive supply voltage.

3. An emitter-coupled logic (ECL) output pulldown circuit as in claim 1, further comprising:

a constant current source having a constant current source input and a constant current source output, wherein the constant current source input is connected to the capacitor positive terminal, and the constant current source output is connected to a voltage source.

4. An emitter-coupled logic (ECL) output pulldown circuit as in claim 3, wherein the constant current source comprises:

a constant current source transistor having a constant current source collector, a constant current source emitter, and a constant current source base; and a constant current source resistor having a resistor positive terminal and a resistor negative terminal;

wherein the constant current source collector is the constant current source input, and the resistor negative terminal is the constant current source output, and wherein the constant current source emitter is connected to a resistor positive terminal, and the constant current source base is connected to a reference voltage.

5. An emitter-coupled logic (ECL) output pulldown circuit as in claim 3, further comprising:
a control current source having a control current source input and a control current source output, wherein the control current source input is connected to the diode output, and the control current source output is connected to said voltage source.

6. An emitter-coupled logic (ECL) output pulldown circuit as in claim 1, wherein the temporary storage capacitor is at least half as large as an output load capacitance connected to the output node.

7. An emitter-coupled logic (ECL) output circuit, that charges a first output node and discharges a second output node based upon an increase in voltage at a first collector node and based upon a reduction in voltage at a second collector node, and that discharges the first output node and charges the second output node based upon an increase in voltage at the second collector node and based upon a reduction in voltage at the first collector node, the output circuit comprising:
- a first pulldown transistor having a first pulldown collector, a first pulldown emitter, and a first pulldown base;
- a first temporary storage capacitor having a first positive capacitor terminal and a first negative capacitor terminal;
- a first diode having a first diode input and a first diode output;
- a first pullup transistor having a first pullup collector, a first pullup emitter, and a first pullup base;
- a second pulldown transistor having a second pulldown collector, a second pulldown emitter, and a second pulldown base;
- a second temporary storage capacitor having a second positive capacitor terminal and a second negative capacitor terminal;
- a second diode having a second diode input and a second diode output; and
- a second pullup transistor having a second pullup collector, a second pullup emitter, and a second pullup base;
- wherein the first pulldown collector is connected to the first output node, the first pulldown base is directly connected to the first diode output, and the first pulldown emitter is connected to the first positive capacitor terminal,
- wherein the first pullup collector is connected to the positive supply voltage, the first pullup base is connected to the first collector node, and the first pullup emitter is connected to the first output node,
- wherein the second pulldown collector is connected to the second output node, the second pulldown base is directly connected to the second diode output, and the second pulldown emitter is connected to the second positive capacitor terminal,
- wherein the second pullup collector is connected to the positive supply voltage, the second pullup base is connected to the second collector node, and the second pullup emitter is connected to the second output node, and
- wherein the first pullup emitter is connected to the second diode input, and the second pullup emitter is connected to the first diode input.

8. An emitter-coupled logic (ECL) output circuit, that charges a first output node based upon an increase in voltage at a first collector node and based upon a reduction in voltage at a second collector node, and that discharges the first output node based upon an increase in voltage at the second collector node and based upon a reduction in voltage at the first collector node, the output circuit comprising:
- a first pulldown transistor having a first pulldown collector, a first pulldown emitter, and a first pulldown base;
- a first temporary storage capacitor having a first positive capacitor terminal and a first negative capacitor terminal;
- a first diode having a first diode input and a first diode output;
- a first control transistor having a first control collector, a first control emitter, and a first control base; and
- a first pullup transistor having a first pullup collector, a first pullup emitter, and a first pullup base;
- wherein the first control collector is connected to a positive supply voltage, the first control base is connected to the second collector node, and the first control emitter is connected to the first diode input,
- wherein the first pulldown collector is connected to the first output node, the first pulldown base is directly connected to the first diode output, and the first pulldown emitter is connected to the first positive capacitor terminal, and
- wherein the first pullup collector is connected to the positive supply voltage, the first pullup base is connected to the first collector node, and the first pullup emitter is connected to the first output node.

9. An emitter-coupled logic (ECL) output circuit as in claim 8, that further charges a second output node based upon an increase in voltage at the second collector node and based upon a reduction in voltage at the first collector node, and that further discharges the second output node based upon an increase in voltage at the first collector node and based upon a reduction in voltage at the second collector node, the output circuit further comprising:
- a second pulldown transistor having a second pulldown collector, a second pulldown emitter, and a second pulldown base;
- a second temporary storage capacitor having a second positive capacitor terminal and a second negative capacitor terminal;
- a second diode having a second diode input and a second diode output;
- a second control transistor having a second control collector, a second control emitter, and a second control base; and
- a second pullup transistor having a second pullup collector, a second pullup emitter, and a second pullup base;
- wherein the second control collector is connected to the positive supply voltage, the second control base is directly connected to the first collector node, and the second control emitter is connected to the second diode input,
- wherein the second pulldown collector is connected to the second output node, the second pulldown base is connected to the second diode output, and the second pulldown emitter is connected to the second positive capacitor terminal, and
- wherein the second pullup collector is connected to the positive supply voltage, the second pullup base is connected to the second collector node, and the second pullup emitter is connected to the second output node.

10. An emitter-coupled logic (ECL) output pulldown circuit that discharges an output node based upon a reduction in voltage at a difference amplifier collector node, comprising:

a pulldown transistor having a pulldown collector, a pulldown emitter, and a pulldown base;

a temporary storage capacitor having a positive capacitor terminal and a negative capacitor terminal;

a diode having a diode input and a diode output; and a control transistor having a control collector, a control emitter, and a control base;

wherein the control collector is connected to a positive supply voltage, the control base is connected to the difference amplifier collector node, and the control emitter is connected to the diode input, and wherein the pulldown collector is connected to the output node, the pulldown base is connected to the diode output, and the pulldown emitter is connected to the positive capacitor terminal.

11. An emitter-coupled logic (ECL) output circuit, that charges a first output node and discharges a second output node based upon an increase in voltage at a first difference amplifier collector node and based upon a reduction in voltage at a second difference amplifier collector node, and that discharges the first output node and charges the second output node based upon an increase in voltage at the second difference amplifier collector node and based upon a reduction in voltage at the first difference amplifier collector node, the output circuit comprising:

a first pulldown transistor having a first pulldown collector, a first pulldown emitter, and a first pulldown base;

a first temporary storage capacitor having a first positive capacitor terminal and a first negative capacitor terminal;

a first diode having a first diode input and a first diode output;

a first pullup transistor having a first pullup collector, a first pullup emitter, and a first pullup base;

a second pulldown transistor having a second pulldown collector, a second pulldown emitter, and a second pulldown base;

a second temporary storage capacitor having a second positive capacitor terminal and a second negative capacitor terminal;

a second diode having a second diode input and a second diode output; and a second pullup transistor having a second pullup collector, a second pullup emitter, and a second pullup base;

wherein the first pulldown collector is connected to the first output node, the first pulldown base is connected to the first diode output, and the first pulldown emitter is connected to the first positive capacitor terminal, wherein the first pullup collector is connected to the positive supply voltage, the first pullup base is connected to the first difference amplifier collector node, and the first pullup emitter is connected to the first output node, wherein the second pulldown collector is connected to the second output node, the second pulldown base is connected to the second diode output, and the second pulldown emitter is connected to the second positive capacitor terminal, wherein the second pullup collector is connected to the positive supply voltage, the second pullup base is connected to the second difference amplifier collector node, and the second pullup emitter is connected to the second output node, and wherein the first pullup emitter is connected to the second diode input, and the second pullup emitter is connected to the first diode input.

12. A circuit that discharges an emitter coupled logic (ECL) output node based upon a pulldown control signal comprising:

a pulldown transistor having a pulldown collector, a pulldown emitter, and a pulldown base;

a temporary storage capacitor having a temporary storage capacitor positive terminal and a temporary storage capacitor negative terminal;

a constant current source having a constant current source input and a constant current source output;

a discharge transistor having a discharge collector, a discharge emitter, and a discharge base;

a control capacitor having a control capacitor positive terminal and a control capacitor negative terminal; and a control transistor having a control collector, a control emitter, and a control base;

wherein the pulldown collector is connected to the output node, the pulldown base is connected to the pulldown control signal, and the pulldown emitter is connected to the temporary storage capacitor positive terminal.

wherein the constant current source input is connected to the temporary storage capacitor positive terminal and the current flowing therethrough flows to a voltage source, wherein the discharge collector is connected to the temporary storage capacitor positive terminal, and the discharge base is connected to the control capacitor negative terminal, and wherein the control capacitor positive terminal is connected to the output node, and the control emitter is connected to the control capacitor negative terminal.

13. A circuit that discharges an emitter coupled logic (ECL) output node as in claim 12, wherein the control collector is connected to a positive supply voltage.

14. A circuit that discharges an emitter coupled logic (ECL) output node as in claim 12, wherein the control emitter is connected to the control capacitor negative terminal.

15. A circuit that discharges an emitter coupled logic (ECL) output node as in claim 12, wherein the discharge emitter is connected to a negative supply voltage.

16. A circuit that discharges an emitter coupled logic (ECL) output node as in claim 12, wherein the temporary storage capacitor negative terminal is connected to ground.

17. A circuit that discharges an emitter coupled logic (ECL) output node as in claim 12, wherein the constant current source comprises:

a current source transistor having a current source collector, a current source emitter, and a current source base; and a current source resistor having a resistor positive terminal and a resistor negative terminal;

wherein the current source collector is the constant current source input, and the resistor negative terminal is the current source output, the current source emitter is connected to a resistor positive terminal, and the current source base is connected to a reference voltage, and wherein the control base is connected to the reference voltage.

18. A method of driving an emitter-coupled logic (ECL) output node having a load capacitance initially at a first voltage corresponding to a high logic value, the method comprising the steps of:

transferring a charge from the load capacitance to a temporary holding capacitor having a temporary holding capacitor positive terminal so as to reduce the output node to a second voltage corresponding to a low logic value; and discharging a control capacitor having a positive control capacitor terminal connected to the output node and a negative control capacitor terminal connected to a base of a discharge transistor having a collector connected to the temporary holding capacitor positive terminal, such that the discharge transistor does not conduct current during the discharging of the control capacitor.

19. A method of driving an emitter-coupled logic (ECL) output node as in claim 18, the method further comprising the steps of:

charging the output node to the first voltage;

charging the control capacitor so as to forward bias the discharge transistor; and discharging the temporary holding capacitor through the collector of the discharge transistor.

20. A method of driving an emitter-coupled logic (ECL) output node as in claim 18, wherein the step of transferring a charge from the load capacitance to a temporary holding capacitor is performed by a pulldown transistor.

21. A method of driving an emitter-coupled logic (ECL) output node as in claim 18, wherein the step of discharging the control capacitor is performed by a control transistor.

22. A method of driving an emitter-coupled logic (ECL) output node as in claim 18, wherein the transferring and discharging steps occur simultaneously.

23. A method of driving an emitter-coupled logic (ECL) output node as in claim 19, wherein the steps of charging the output node, charging the control capacitor, and discharging the temporary holding capacitor occur simultaneously.

24. A method of driving an emitter-coupled logic (ECL) output node as in claim 23, wherein the temporary holding capacitor is at least as large as the output capacitance, and the control capacitor is smaller than the temporary holding capacitor.

25. An emitter-coupled logic (ECL) output circuit, that charges a first output node based upon an increase in voltage at a first difference amplifier collector node and based upon a reduction in voltage at a second difference amplifier collector node, and that discharges the first output node based upon an increase in voltage at the second difference amplifier collector node and based upon a reduction in voltage at the first difference amplifier collector node, the output circuit comprising:

a first pulldown transistor having a first pulldown collector, a first pulldown emitter, and a first pulldown base;

a first temporary storage capacitor having a first positive capacitor terminal and a first negative capacitor terminal;

a first diode having a first diode input and a first diode output;

a first control transistor having a first control collector, a first control emitter, and a first control base; and a first pullup transistor having a first pullup collector, a first pullup emitter, and a first pullup base;

wherein the first control collector is connected to a positive supply voltage, the first control base is connected to the second difference amplifier collector node, and the first control emitter is connected to the first diode input, wherein the first pulldown collector is connected to the first output node, the first pulldown base is connected to the first diode output, and the first pulldown emitter is connected to the first positive capacitor terminal, and wherein the first pullup collector is connected to the positive supply voltage, the first pullup base is connected to the first difference amplifier collector node, and the first pullup emitter is connected to the first output node.

26. An emitter-coupled logic (ECL) output circuit as in claim 25, that further charges a second output node based upon an increase in voltage at the second difference amplifier collector node and based upon a reduction in voltage at the first difference amplifier collector node, and that further discharges the second output node based upon an increase in voltage at the first difference amplifier collector node and based upon a reduction in voltage at the second difference amplifier collector node, the output circuit further comprising:

a second pulldown transistor having a second pulldown collector, a second pulldown emitter, and a second pulldown base;

a second temporary storage capacitor having a second positive capacitor terminal and a second negative capacitor terminal;

a second diode having a second diode input and a second diode output;

a second control transistor having a second control collector, a second control emitter, and a second control base; and a second pullup transistor having a second pullup collector, a second pullup emitter, and a second pullup base;

wherein the second control collector is connected to the positive supply voltage, the second control base is connected to the first difference amplifier collector node, and the second control emitter is connected to the second diode input, wherein the second pulldown collector is connected to the second output node, the second pulldown base is connected to the second diode output, and the second pulldown emitter is connected to the second positive capacitor terminal, and wherein the second pullup collector is connected to the positive supply voltage, the second pullup base is connected to the second difference amplifier collector node, and the second pullup emitter is connected to the second output node.

\* \* \* \* \*